United States Patent [19]

Bach et al.

[11] Patent Number: 5,523,676
[45] Date of Patent: Jun. 4, 1996

[54] SAMPLE AND HOLD METHOD AND APPARATUS FOR SENSING INDUCTIVE LOAD CURRENT

[75] Inventors: James C. Bach, Carmel; John L. Kastura, Kokomo, both of Ind.

[73] Assignee: Delco Electronics Corp., Kokomo, Ind.

[21] Appl. No.: 220,654

[22] Filed: Mar. 31, 1994

[51] Int. Cl.$^6$ ................................................. G01R 19/04
[52] U.S. Cl. ........................................ 324/103 P; 324/111
[58] Field of Search ............................... 363/98; 318/811; 324/103 P, 111; 364/483

[56] References Cited

U.S. PATENT DOCUMENTS

| | | | |
|---|---|---|---|
| 3,564,407 | 2/1971 | Metcalf et al. | 324/120 |
| 4,208,626 | 6/1980 | Gregg, Jr. | 324/77 A |
| 4,641,246 | 2/1987 | Halbert et al. | 364/487 |
| 4,646,004 | 2/1987 | Brandt et al. | 324/79 R |
| 4,807,147 | 2/1989 | Halbert et al. | 364/487 |
| 5,079,494 | 1/1992 | Reichard | 318/811 |
| 5,341,286 | 8/1994 | Inoue | 363/98 |

Primary Examiner—Ernest F. Karlsen
Assistant Examiner—Russell M. Kobert
Attorney, Agent, or Firm—Mark A. Navarre

[57] ABSTRACT

An inductive load energized by a variable duty cycle pulse signal contains ripple at steady state conditions, and the average current is used as feedback to a controller. The average current is obtained without filtering by synchronously sampling the local maxima and minima of the current and averaging the last two samples. The maxima and minima are detected by sampling at the falling and rising edges of the pulse signal. The method is implemented by software in a microprocessor or by hardware comprising a pulse generator, sample and hold circuits, and an averager. The resulting average value is then asynchronously sampled by a microprocessor.

10 Claims, 5 Drawing Sheets

SAMPLE AND HOLD METHOD AND APPARATUS FOR SENSING INDUCTIVE LOAD CURRENT

FIELD OF THE INVENTION

This invention relates to a method and apparatus for measuring the average current in an inductive load and particularly for such a current which is controlled by pulse modulation of voltage applied to the inductive load.

BACKGROUND OF THE INVENTION

For current control purposes it is often desired to measure the average or RMS value of the current flowing through an inductive device such as a solenoid, control valve or relay coil which is supplied by a pulse width modulated voltage. By varying the duty cycle of the applied voltage the current can be controlled to some desired average value. Because the rate of current increase or decrease through the inductive device is controlled primarily by the L/R time constant of the device, and since this time constant tends to be on the same order as the period of the PWM signal, considerable ripple often appears in the current waveform; the waveform tends to look somewhat like a triangle wave.

Traditional control system approaches to removing this ripple usually involve the use of a low-pass filter; the time constant and number of poles of the filter determine the ripple attenuation level and the step response of the system. Usually these two considerations tend to work against each other; heavy low-pass filtering, i.e. good ripple rejection, leads to poor step response and vice versa. Thus to preserve system response to avoid ringing or overshoot in the control system, only light filtering is used. Then some ripple will be evident in the filtered signal and when occasional current samples are read to obtain feedback data for control purposes, the samples dither about the average current, even during steady state conditions.

For example, in a system using 300 or 600 Hz PWM solenoid coil activation where time constant consistency is important, tight tolerance parts are used to construct a low-pass RC filter at high expense. Because the ripple signal is at 300 or 600 Hz, and the filter −3 dB point is 46 Hz, not all of the ripple is attenuated (only about 16 to 22 dB). Moreover, because the filter has a fairly long time constant (3.465 msec) compared to the time constant of the solenoid (about 7 msec), the output of the filter greatly lags the actual current during a step change in current. FIG. 1 illustrates the waveforms for this arrangement, the graphs beginning shortly after initial load energization so that the current is approaching its steady state condition. FIG. 1A shows a PWM control signal which has a 90% ON duty cycle. The remaining graphs show current in the narrow range of 1.73 to 1.83 amps. FIG. 1B shows the increasing actual current while FIG. 1C shows the RC filtered current, the ripple being evident. FIG. 1D shows the current as sampled periodically by a microprocessor. Aliasing-induced ripple occurs due to the asynchronous operation of the PWM and the sampling, that is, because the sampling period is different from the ripple period the ripple appears as dither in the sampled value as evidenced by dips in the waveform.

Thus it is apparent that it is desirable to determine the average current in an inductive load driven by a PWM input with low ripple (no ripple for steady state conditions), reduced lag during current transients, and at a lower cost.

SUMMARY OF THE INVENTION

It is therefore an object of the invention to determine the average current in an inductive load driven by a variable duty cycle pulsed voltage, the determined current having no ripple at steady state conditions. It is another object to make such a current determination in a manner which minimizes the lag in response to a step change of current. Still another object is to achieve these advances at a lower cost than high quality RC filtering.

The invention is carried out in the context of a microprocessor based system for generating a PWM signal for energizing an inductive load and reading load current feedback for comparison to a desired current. The feedback current is sampled at its local maxima and minima values and averaged to determine the average current. The average current will be constant for a steady state condition and is read at any time by the microprocessor. The current determination method can be implemented in software or hardware.

In the context of microprocessor control of the current wherein A/D conversion of current values provide processor input, a software solution is to synchronize the A/D conversions with the PWM waveform, so that all samples are taken at the same point in each cycle of the waveform, preferably midway between waveform edges where the current approximates the average value. Alternatively, samples can be taken at the rise and fall of the PWM control signal so that the minimum and maximum current could be measured, and then software could be used to calculate the average of the two. At low pulse frequencies and moderate duty cycles these approaches are useful, however at the higher PWM frequencies this becomes impractical due to the following considerations:

1) Software through-put burden (repeatedly interrupting the processor in order to take samples) wastes some of the processor's time by taking samples that often are not used.

2) Interrupt latencies (dither in actual sample time due to processor being busy when PWM edge occurs) cause sampling to occur after the true min/max points.

3) Lack of time at duty cycle extremes (i.e. near 0% and 100%) when edges are close together.

Thus it is evident that this approach, while useful, does not yield a universal solution to the determination of the average current.

Preferably the current determination method is implemented in hardware responsive to the PWM signal and the load current. A sample pulse generator responds to the PWM signal by issuing a sample pulse at each edge of the PWM signal. A first sample and hold circuit is triggered by the sample pulses occurring at rising edges when the current is at minimum values to thereby sample and store a minimum current value. Similarly, a second sample and hold circuit is triggered by sample pulses occurring at falling edges when the current is at maximum value to thereby sample and store a maximum current value. Each stored value is updated at a pulse edge when the respective maximum or minimum current occurs. These two current values are averaged by an averaging circuit to yield the average current. Then the microprocessor asynchronously reads the average current.

The result of this method is that the measured average current is constant at steady state conditions, thus avoiding ripple, and the microprocessor reads current data only when desired, to thus minimize processor burden. Also, since heavy filtering is not used the time lag during current transients is reduced; the measured average current will (on average)lag the actual average current by one-half PWM cycle, although additional delay may occur in dependence on the sampling time of the microprocessor.

BRIEF DESCRIPTION OF THE DRAWINGS

The above and other advantages of the invention will become more apparent from the following description taken in conjunction with the accompanying drawings wherein like references refer to like parts and wherein.

DESCRIPTION OF THE INVENTION

Figure 1A:
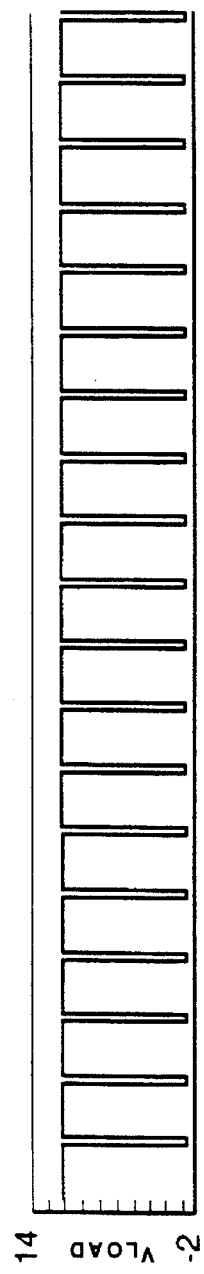
FIGS. 1A–1D are waveforms occurring in an inductive current control system using current filtering according to prior art practices.
Figure 1B:
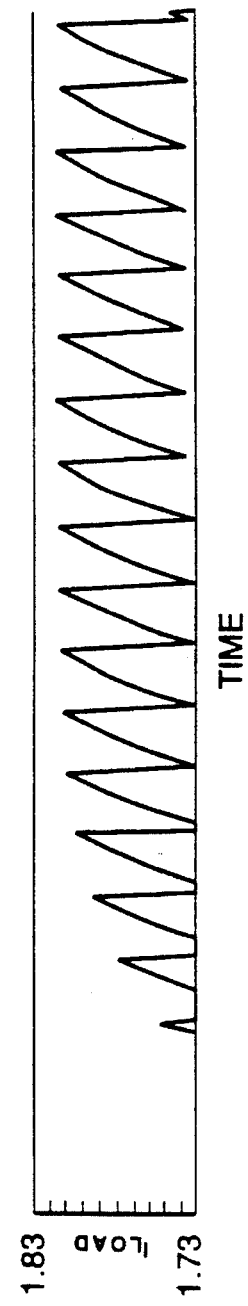
Figure 1C:
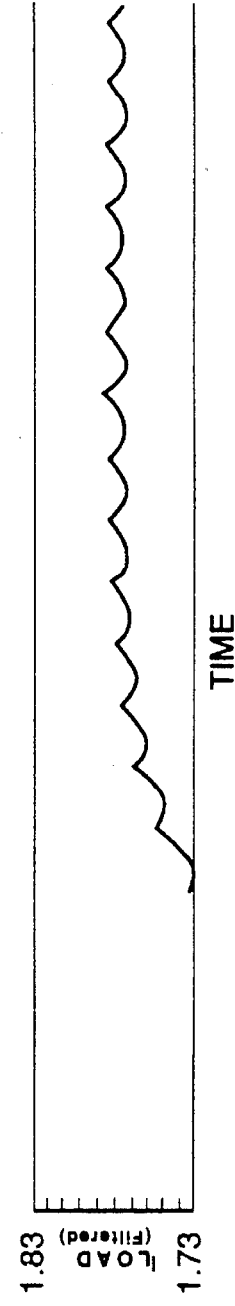
Figure 1D:
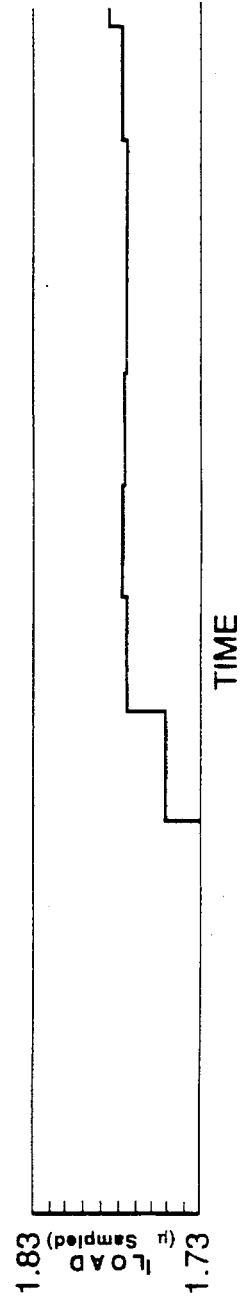
Figure 2:
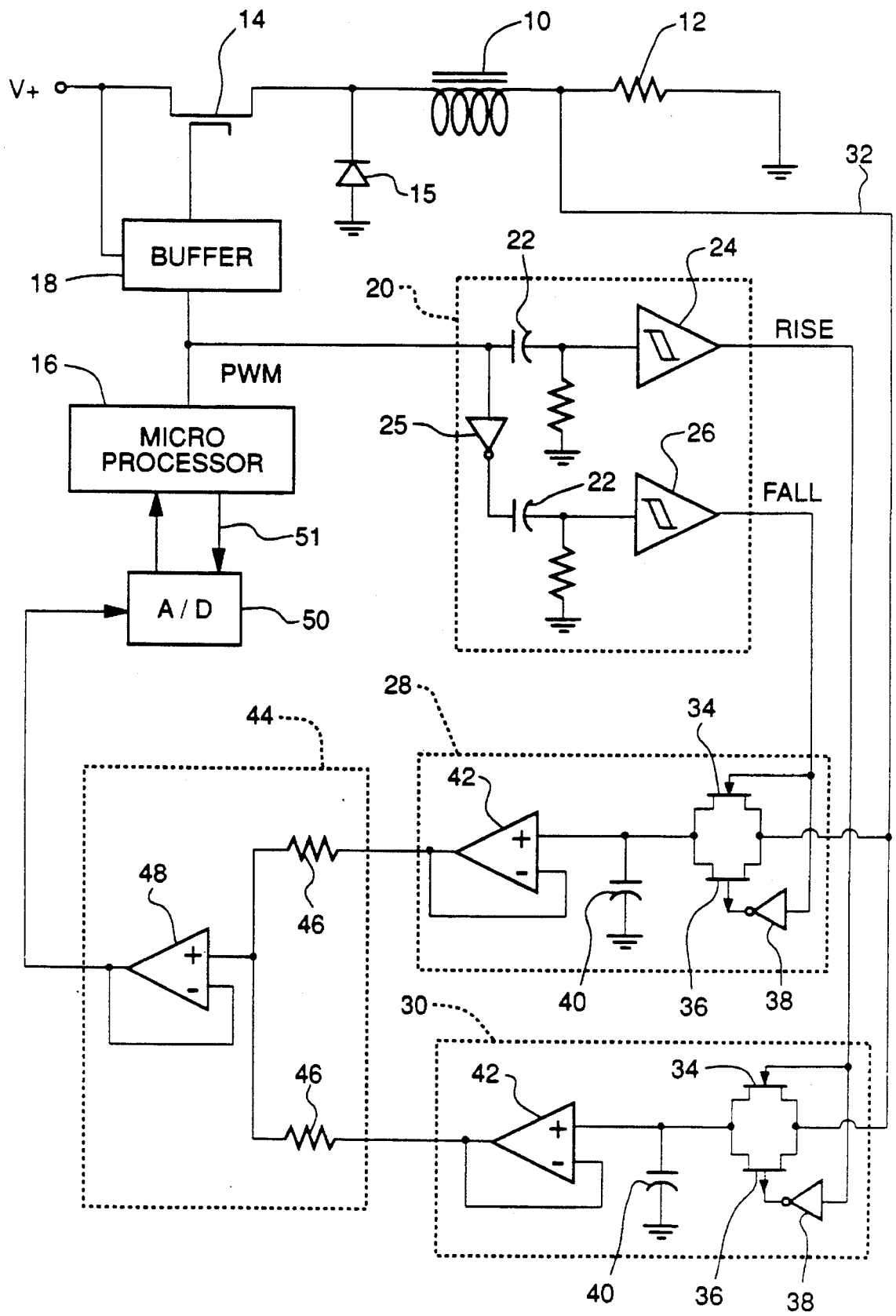
FIG. 2 is a schematic diagram of an inductive load current control system implementing the method of the invention.

Referring to FIG. 2, an inductive load 10 such as a solenoid is connected through a current sensing resistor 12 to ground at one end and coupled at the other end to a voltage source V+ through a switch 14 such as an FET. A diode 15 between ground and the junction of the FET and the load permits load current recirculation when the switch 14 is off. The switch 14 is controlled by a pulse width modulated (PWM) signal from a microprocessor controller 16 which regulates the load current by varying the duty cycle of the PWM signal. The PWM signal is coupled through a buffer 18 to the control gate of the FET. Current feedback is used to enable the microprocessor to compare the average current to the desired current value and adjust the PWM as needed. Current sensing and feedback circuitry to accomplish this includes a sample pulse generator 20 having an input coupled to the PWM signal and having two outputs, a first one yielding a pulse synchronous with each rising edge of the PWM waveform and the second one yielding a pulse synchronous with each falling edge of the PWM waveform. The input is coupled through a first differentiating capacitor 22 to a first Schmitt trigger 24 and through an inverter 25 to another capacitor 22 and a second Schmitt trigger 26 to yield sample pulses on the rising edge and the falling edge respectively. Two sample and hold circuits 28 and 30 have control inputs coupled to the first and second outputs, respectively, of the pulse generator 20. Each sample and hold circuit has an analog input connected by line 32 to the junction of the load 10 and the current sensing resistor 12 which develops a voltage representing the load current. Each analog input is fed through a pair of complementary FETs 34, 36 which are simultaneously turned on by a sample pulse fed directly to one FET 34 and through an inverter 38 to the other FET 36. A large low leakage storage capacitor 40 retains the sampled voltage after the FETs are turned off, and a high input impedance buffer 42 couples the stored voltage to the output. Due to high input impedance of the buffer 42, the voltage of the capacitor 40 is not significantly diminished while in the hold mode. The sample and hold outputs represent the maxima and minima of the current waveform and are fed to a summer or averager 44 which comprises a pair of equal valued resistors 46 connected from the sample and hold outputs to an input of a buffer 48. The buffer 48 in turn supplies the average current to an analog-to-digital converter 50. The A/D converter 50 has its digital output coupled to the microprocessor 16 which in turn has a control line 51 to the A/D converter to command a current read event. It is feasible to implement all of the sampling and averaging circuitry on an integrated circuit provided that the IC process allows large, low-leakage capacitors, high input impedance amplifier stages, and low-leakage FET switches.

Figure 3A:
FIGS. 3A–3E are waveforms occurring in an inductive current control system according to the invention.
Figure 3B:
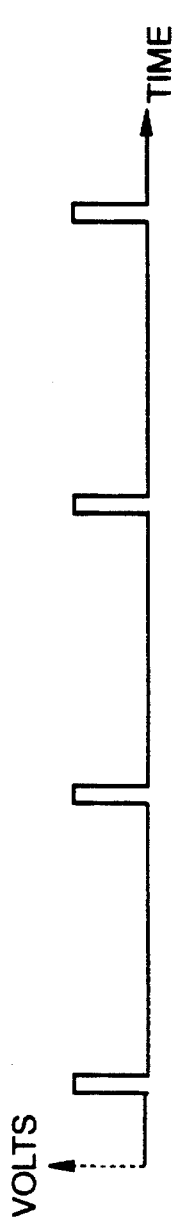
Figure 3C:
Figure 3D:
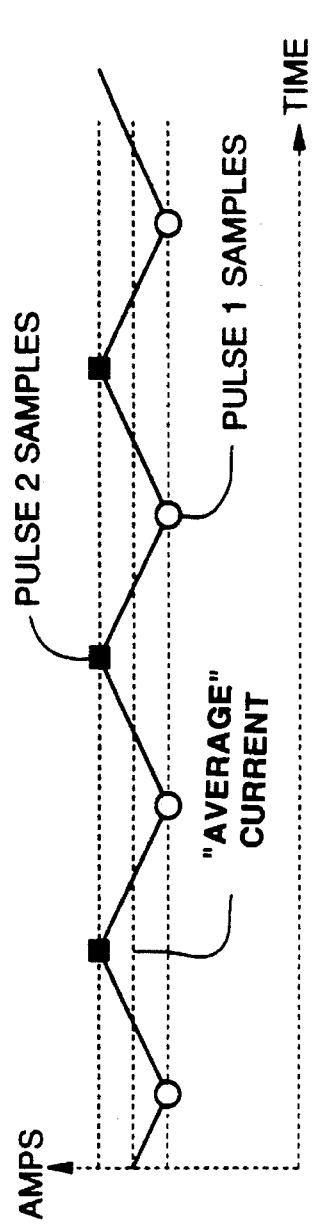
Figure 3E:
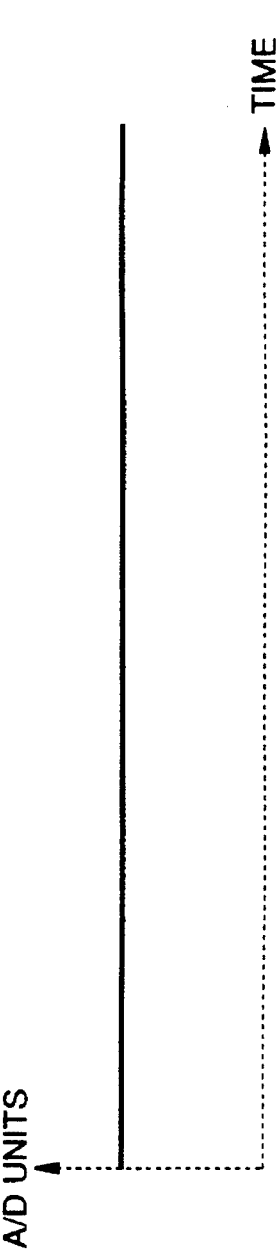

The operation of the current sensing and feedback circuitry is illustrated by the graphs of FIGS. 3A to 3E for a load current operating at steady state. FIG. 3A shows a PWM signal having a 50% duty cycle and FIGS. 3B and 3C, respectively, show the sample pulses generated at rising and falling edges of the PWM signal. The load current is depicted at FIG. 3D; the current increases from a local minimum where the rising edge occurs to a local maximum where the falling edge occurs, and then decreases until another rising edge occurs. Since the sample and hold circuit 30 is triggered at each rising edge it will capture each local minimum current value and hold it until updated by the next local minimum current value. Similarly the sample and hold circuit 28 captures each maximum current value. Since the average current is midway between the minimum and maximum values, the average current is the average of the most recent stored readings in the sample and hold circuits 28 and 30. That average value as shown in FIG. 3E is read by the A/D converter 50 and is sampled as desired and used as the current feedback value to the microprocessor. Due to the synchronous sampling of the current waveform there is no ripple produced in the average current during steady state operation, and since the measured average current has no ripple and is not dependent on the PWM frequency, there is no aliasing occurring due to microprocessor sampling at a different frequency. While this circuit supposes that the microprocessor 16 generates the PWM waveform, the same sampling and feedback circuitry will apply even if the PWM signal is generated by a separate circuit having its duty cycle determined by the microprocessor.

Figure 4:
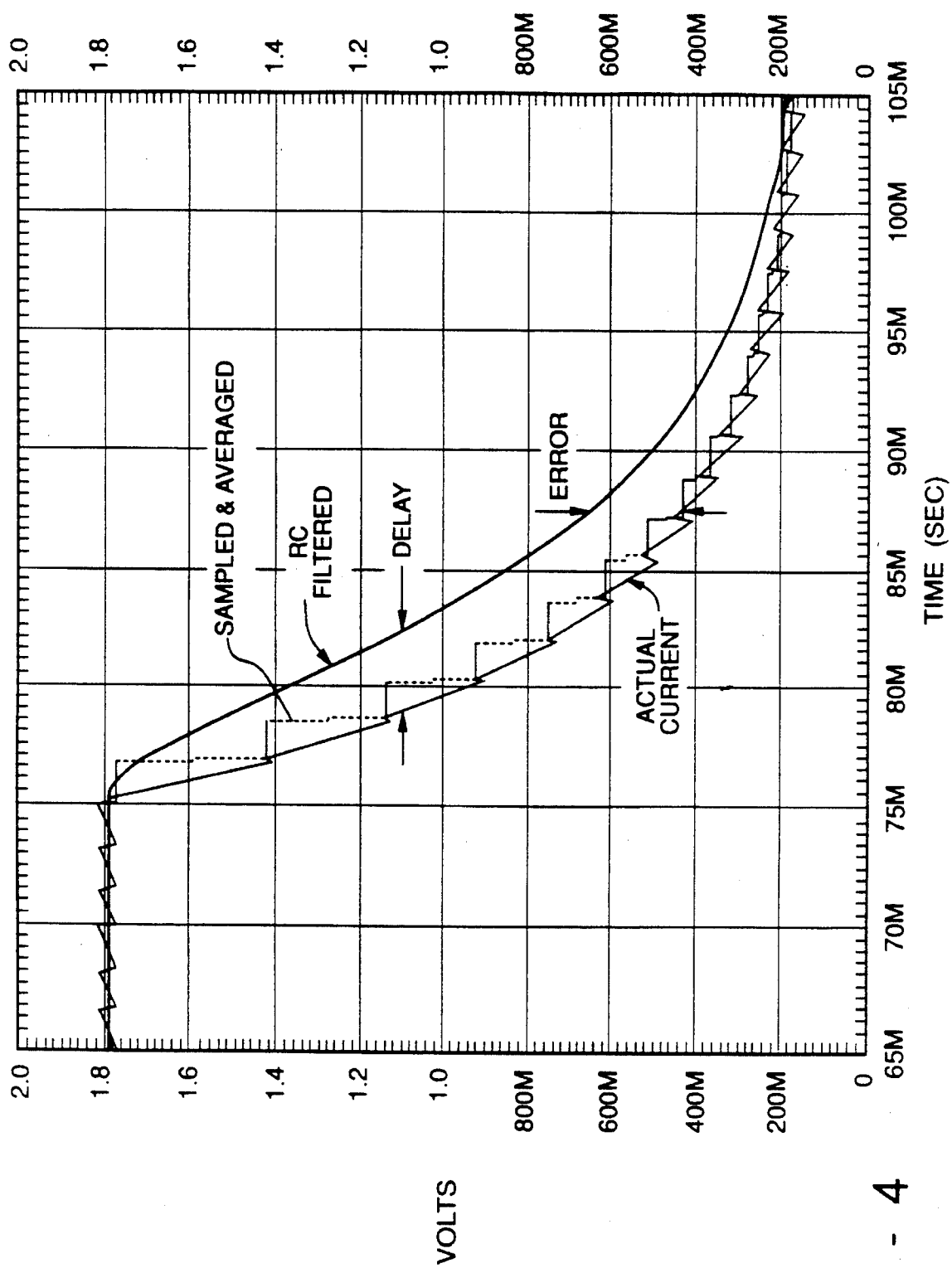
FIG. 4 is a graphical illustration of actual current, sampled-and-averaged current and filtered current for a step change in pulse duty cycle.

This method also results in minimal lag in response. The graph of FIG. 4 illustrates the case of a step change of PWM from 90% ON duty cycle to a 10% ON duty cycle. The actual current decays rapidly and the RC filtered value, if used, exhibits a time delay so that sampling the filtered value at any given time would result in a substantial error. The sampled and averaged value, however, decreases step-wise and follows the actual current much more closely than the filtered value.

Figure 5:
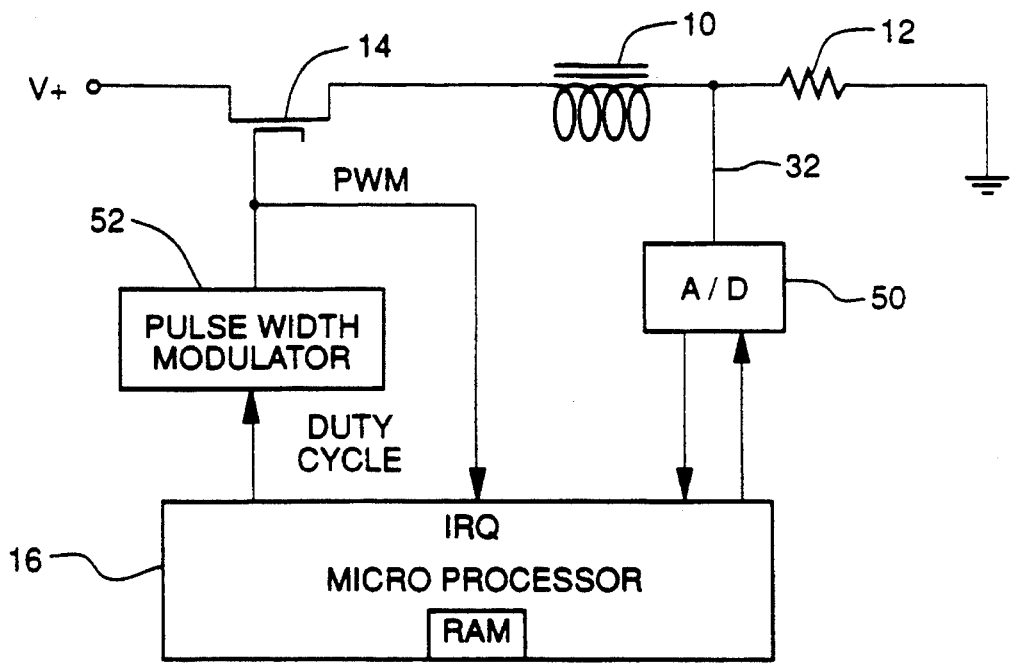
FIG. 5 is a circuit diagram for an inductive load current control relying on a software implementation of the invention.

The general method of determining average current by synchronously sampling load current at the local maxima and minima, averaging the last two samples, and reading the average asynchronously can be carried out by software as well, given an analog input representing current to the microprocessor. FIG. 5 shows the inductive load 10, FET switch 14, current sensing resistor 12 and microprocessor controller 16 as in the FIG. 2 system, but with the PWM signal supplied by a PWM circuit 52 having its duty cycle controlled by the microprocessor 16. The signal representing load current is coupled to the microprocessor 16 via an A/D converter 50. The A/D output is connected to a processor port and a control line from the processor 16 to the A/D causes retrieval of the digital value representing the load current. The PWM signal is fed to an interrupt port of the processor 16. A Random Access Memory (RAM) stores the sampled values as well as the calculated average in the microprocessor. It should be noted that the A/D converter 50 and/or the PWM circuitry 52 could also be within the microprocessor 16.

Figure 6:
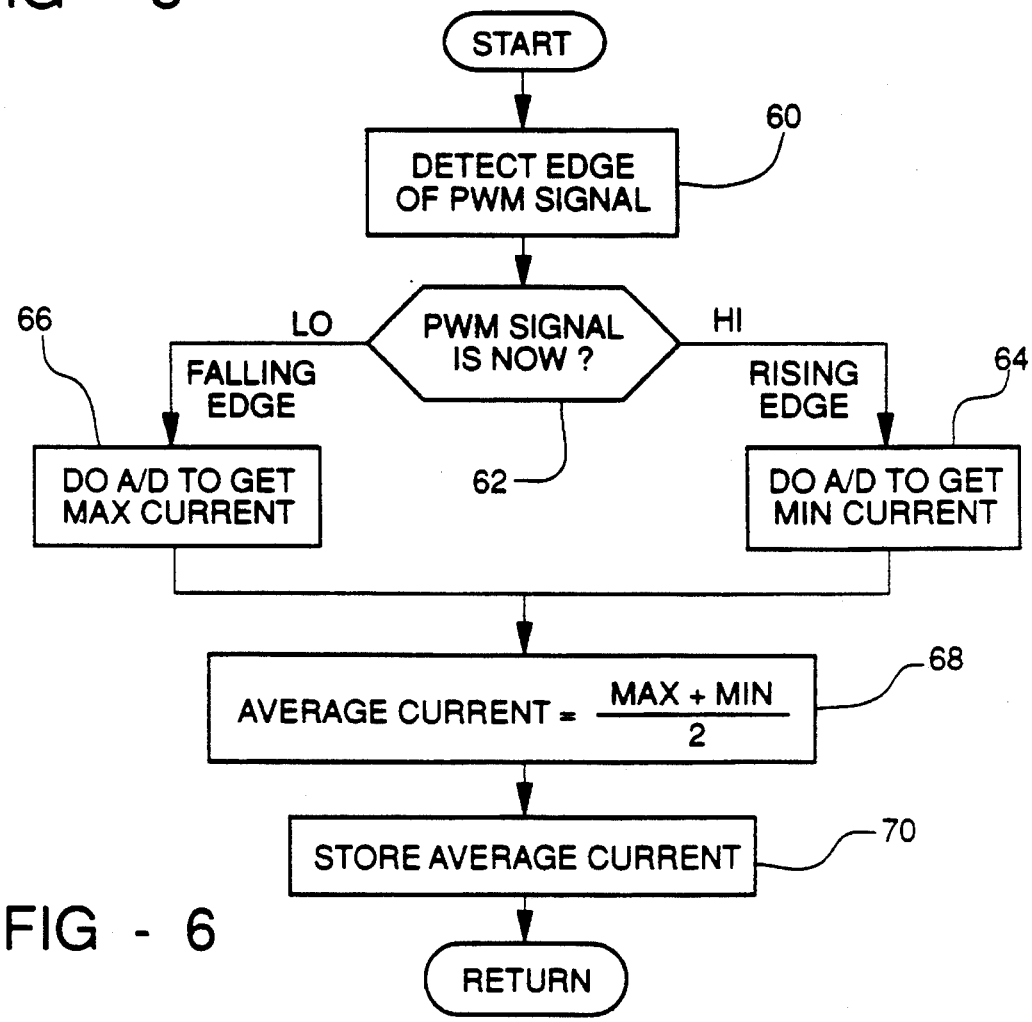
FIG. 6 is a flow chart representing a program for the control of FIG. 5.

The flow chart of FIG. 6 shows, in general, a software procedure for carrying out the sampling and averaging method. In general, the software steps implement the same functions as the hardware described above. The PWM signal at the interrupt port of the microprocessor is monitored for the occurrence of an edge in block 60. When an edge occurs the new PWM signal level is inspected to determine whether the signal is now high or low (block 62). If the PWM signal is high (rising edge) the current has just reached a local minima and that minimum current value is retrieved via the A/D converter (block 64) and stored in RAM. Similarly, if the PWM signal is low (falling edge), the load current has just reached a local maximum and that current value is retrieved (block 66) and stored in RAM. Then, in block 68, the average current is calculated from the latest values of the maximum and minimum currents. The average current is stored (block 70) and is accessed at any time as required by the current control algorithm of the microprocessor, and is updated each time a maximum or minimum occurs. Thus the synchronous sampling of the load current to capture local current maxima and minima, averaging and asynchronously retrieving the measured average is accomplished by software, but at the expense of increased microprocessor burden. In applications where the PWM frequency is low and the duty cycle does not reach extreme values, the increased burden is not great and accurate current measurements are obtained.

Thus both a hardware approach and a software approach are disclosed to implement the method of determining the average inductive load current under control of a pulsed signal whereby ripple is eliminated from the average current for steady state values and time delay between measured and actual current is minimized during rapid current changes.

We claim:

1. Apparatus for sensing average current in an inductive load energized by a pulsed voltage causing a current waveform exhibiting local maxima and minima comprising:

means for synchronously sampling the current at local current maxima and minima and for storing values representing the most recent of each of the current maxima and minima samples;

means for averaging the stored values to yield an average value which is a measure of the average current; and a microprocessor for asynchronously sampling the average value, whereby the sensed current has no ripple during steady state conditions.

2. The invention as defined in claim 1 wherein the local current maxima and minima occur at falling and rising edges of the pulsed voltage and the means for synchronously sampling the current comprises means responsive to the pulsed voltage for sampling the current at the falling and rising edges of the pulsed voltage.

3. The invention as defined in claim 1 wherein the means for storing values comprise a pair of capacitors each charged to a voltage representing a current sample.

4. The invention as defined in claim 1 wherein the means for sampling the current and storing values and the means for averaging the stored values comprise analog circuitry.

5. The invention as defined in claim 1 wherein the means for sampling current and storing values includes a sample pulse generator responsive to the pulsed voltage for triggering sampling at the beginning and end of each pulse, and a pair of sample and hold circuits responsive to the load current and coupled to the sample pulse generator for alternately sampling the current and storing values representing the current samples.

6. The invention as defined in claim 5 wherein the sample and hold circuits each include means for storing a voltage representing the current samples.

7. The invention as defined in claim 1 wherein the means for sampling the current and the means for averaging the stored values comprise the microprocessor, whereby the sampled values are stored in microprocessor memory and then averaged to determine the average current value.

8. In a circuit including a microprocessor for controlling current to an inductive load by pulse modulation of applied load voltage wherein the current exhibits ripple, a method of measuring the average current independently of the effects of ripple comprising the steps of:

sampling the current at local maxima and minima of current values;

storing values representing the currents for the two most recent current samples; and averaging the stored values to determine the average load current.

9. The invention as defined in claim 8 wherein a variable duty cycle pulse controls the current by turning the applied voltage on and off at beginning and end of each pulse, and wherein:

the sampling step comprises sampling the current synchronously with the beginning and end of each voltage pulse.

10. The invention as defined in claim 8 wherein control pulses modulate the current and wherein:

the sampling step comprises sampling the current synchronously with the beginning and end of each control pulse; and sampling the average load current asynchronously relative to the control pulses.

\* \* \* \* \*